United States Patent [19]

Watanabe et al.

[11] Patent Number: 5,314,847
[45] Date of Patent: May 24, 1994

[54] SEMICONDUCTOR SUBSTRATE SURFACE PROCESSING METHOD USING COMBUSTION FLAME

[75] Inventors: Tohru Watanabe; Katsuya Okumura, both of Yokohama, Japan

[73] Assignee: Kabushiki Kaisha Toshiba, Kawasaki, Japan

[21] Appl. No.: 768,611

[22] PCT Filed: Feb. 20, 1991

[86] PCT No.: PCT/JP91/00215

§ 371 Date: Oct. 18, 1991

§ 102(e) Date: Oct. 18, 1991

[87] PCT Pub. No.: WO91/13461

PCT Pub. Date: Sep. 5, 1991

[30] Foreign Application Priority Data

Feb. 20, 1990 [JP] Japan ................... 2-38577
Feb. 19, 1991 [JP] Japan ................... 3-24850

[51] Int. Cl.$^5$ ............................ H01L 21/02
[52] U.S. Cl. ................... 437/239; 437/247
[58] Field of Search ............ 437/238, 239, 247

[56] References Cited

U.S. PATENT DOCUMENTS

| 3,903,325 | 9/1975 | Horiuchi | 437/239 |
|---|---|---|---|
| 4,002,512 | 1/1977 | Lim | 437/238 |
| 4,139,658 | 2/1979 | Cohen et al. | 437/239 |
| 4,267,205 | 5/1981 | Pastor et al. | 437/239 |
| 4,268,538 | 5/1981 | Toole et al. | 437/239 |
| 4,275,094 | 6/1981 | Takagi et al. | 437/239 |
| 4,293,590 | 10/1981 | Takagi et al. | 437/239 |
| 4,296,146 | 10/1981 | Penn | 427/58 |
| 4,409,260 | 10/1983 | Pastor et al. | 437/239 |
| 4,845,053 | 7/1989 | Zajac | 437/229 |
| 4,906,595 | 3/1990 | Van Der Plas et al. | 437/239 |
| 5,122,483 | 6/1992 | Sakai et al. | 437/238 |

FOREIGN PATENT DOCUMENTS

0020857 1/1981 European Pat. Off.
57-18328 1/1982 Japan.
8173837 10/1983 Japan.
0186023 9/1985 Japan.

OTHER PUBLICATIONS

Patent Abstracts of Japan, vol. 9, No. 287 (C-314) Nov. 14, 1985; JPP-A-60 131 850, Jul. 13, 1985.
W. Kern, "Densification Of Vapor-Deposited Phosphosilicate Glass Films", RCA Review, vol. 37, No. 1, Mar. 1976, pp. 55–77.

*Primary Examiner*—Olik Chaudhuri
*Assistant Examiner*—Long Pham
*Attorney, Agent, or Firm*—Foley & Lardner

[57] ABSTRACT

In order to provide the processing required to prevent a semiconductor substrate from becoming contaminated or damaged, without heating it in a kiln, a combustion flame of a gas that is a mixture of hydrogen and oxygen is applied to the surface of the semiconductor substrate, so that only the substrate surface is heated. Oxidizing or reducing processing can be provided by varying the ratio of hydrogen to oxygen. A device that enables this processing method comprises a first conduit (6) for guiding hydrogen; a second conduit (7) for guiding oxygen; a flame generation means (5) for combusting the hydrogen and the oxygen in a mixed state to generate a downward-pointing flame over a range wider than the diameter of a semiconductor substrate (1) that is being processed; a flow regulation means (8) and (9) provided midway in each of the first tube and the second tube, for regulating the fluid passing through each of the first tube and the second tube; and a conveyor means (2), (3), and (14) for conveying the semiconductor substrate that is being processed, provided below the flame generation means.

12 Claims, 4 Drawing Sheets

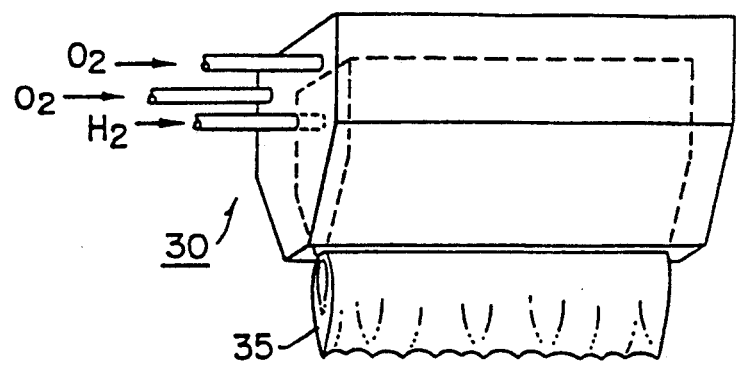
F I G. 3
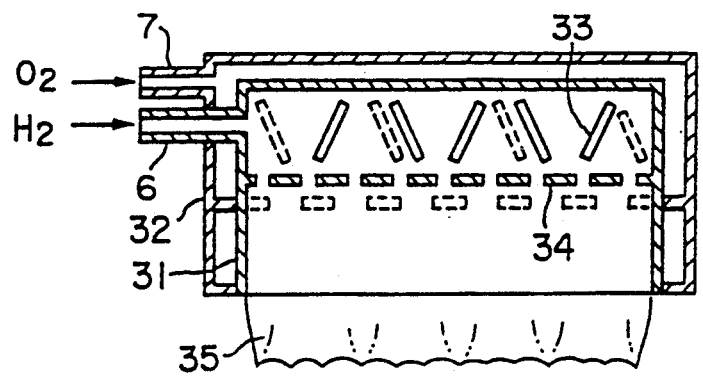
F I G. 4
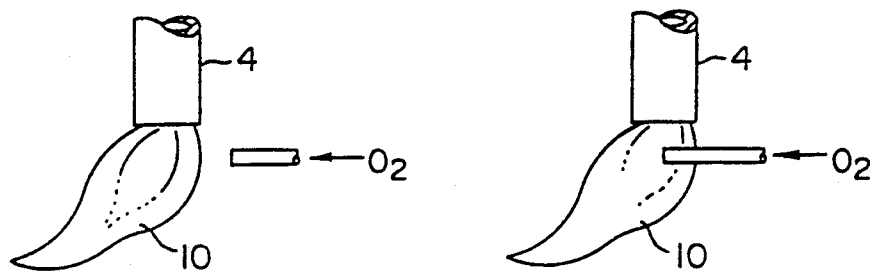
F I G. 5(a)   F I G. 5(b)

SEMICONDUCTOR SUBSTRATE SURFACE PROCESSING METHOD USING COMBUSTION FLAME

TECHNICAL FIELD

The present invention relates to a method of processing a semiconductor substrate surface and a device therefor, and, in particular, to various methods of improving the quality of a semiconductor substrate surface, performed partway during the process of manufacturing an LSI or the like.

BACKGROUND ART

In addition to basic processes such as photolithography, etching, and film growth during the sequence of steps in the manufacture of an LSI, processing that improves the quality of the surface of the semiconductor substrate material is required. There are many different types of such processing, depending on purpose and method—typical examples are described below.

(1) Density Increase Process

An isolating substance such as a silicon oxide layer deposited on a semiconductor substrate by chemical vapor deposition (CVD) has insufficient film properties, not just because the linkages between atoms are insufficient but also because a water component is included. Therefore it is necessary to increase the densities of such films by high-temperature heating. This annealing step is usually done by using a tubular-shaped kiln to heat the substrate in a variety of gas environments, depending on the application.

(2) Interface Reaction Promotion Process

During the process of forming an LSI, a large number of structures where different materials are in direct contact with each other are used, and thermal processing is also used to promote interface reactions between such substances. For example, in order to make contact with a silicon substrate, aluminum or an aluminum alloy is placed in contact with the silicon semiconductor substrate. In order to ensure an electrical path between the two substances, it is known to perform heating to sinter the aluminum using the reducing characteristics of aluminium in a hot environment on a thin silicon oxide film formed on the silicon surface.

In addition, after a thin titanium layer is deposited on a silicon semiconductor substrate by sputtering, titanium silicide ($TiSi_2$) is formed from the reaction between titanium and silicon by thermal processing at about approximately 600° C., and the surface resistance of the silicon semiconductor substrate that is being processed can be reduced thereby. This reaction is usually achieved by heating the silicon semiconductor substrate that is being processed to over approximately 600° C. in a kiln maintained in a nitrogen atmosphere or a vacuum, in order to prevent oxidation of the titanium.

(3) Activation Process

Thermal processing at a high temperature is performed in order to activate impurities inserted into a semiconductor substrate by a method such as ion implantation.

(4) Surface Oxidation Process

In processes such as photolithography, when a film of an organic substance such as resist is formed on a semiconductor substrate surface, a liquid consisting of the resist dissolved in a solvent is coated onto the surface and dried. In this case, particularly when the substrate surface is of aluminum or an aluminum alloy, the liquid of the photoresist coated onto the surface can easily be repelled thereby, and it often happens that the adhesion thereof is insufficient. Therefore, surface oxidation is performed by oxygen plasma processing, to convert the substrate surface into a hydrophilic surface.

(5) Ashing Process

To remove an organic substance such as a resist from a substrate surface, ashing is often used conventionally to oxidize the organic substance into carbon monoxide and carbon dioxide by a discharge plasma of a gas whose main component is oxygen.

(6) Crystallization

With a liquid-crystal substrate, a step that deposits an amorphous layer on a glass plate is used. From the characteristics point of view, single-crystal silicon would be ideal as a silicon layer on this substrate, but in practice this is not possible, so the formation of a polycrystalline silicon layer is preferred. However, since the substrate glass has a low heat resistance, it cannot be heated to the high temperatures at which polycrystalline silicon is formed, and thus the manufacturer must compromise by forming an amorphous silicon layer instead.

(7) Melting

Since a semiconductor device inevitably has a multilayer structure, processing that does not generate differences in height are used. For example, melting is used as a method of flattening inter-layer isolation films such as silicon oxide films. This method uses a kiln to heat to approximately 950° C. an oxide film in which impurities such as PSG (Phospho-Silicate Glass) and BPSG (Boro-Phospho-Silicate Glass) are diffused to lessen softening points, to melt the film and flatten it.

All of the above different substrate surface processes involve problems, as described below.

The first problem is such that, in order to perform any of these processes, the substrate that is being processed is placed in a conventional kiln and is heated therein. However, during the heating in the kiln, the semiconductor substrate becomes contaminated by impurities included in the gases introduced into the kiln or by impurities emitted from the kiln walls that are heated to a high temperature.

The second problem is such that, since it is not only the temperature of the surface that is being processed by the heating in an ordinary kiln that rises, but also the temperature of the semiconductor substrate itself, the maximum processing temperature must be suppressed to a level that the base material of the silicon substrate can withstand. In addition, since substances with various different coefficients of thermal expansion are heated, large stresses are generated and thus faults such as cracks may occur in the formed film. Since the substrate itself is heated, the activation of impurities causes the diffusion of impurities at the same time, so the the high densities desired in the vicinity of the substrate surface for an LSI cannot be achieved.

The third problem is such that with processing that uses plasmas, such as surface oxidation and ashing, the semiconductor substrate is damaged by ion bombardment from the discharge plasma.

The fourth problem is specific to ashing—residues are generated because it is difficult to prevent organic substances from undergoing a self-hardening action due to ultraviolet light generated in a discharge plasma. This situation is described below with reference to FIGS. 7 and 8 which illustrate aluminum lines 51 formed on a semiconductor substrate 50 on which is formed an isolation layer, for example. Resist is coated over a aluminum layer formed by vapor deposition, the resist is exposed and patterned to obtain a resist pattern 52 in the desired line shape, and this is used as an etching mask to etch the aluminum layer to form the aluminum lines 51. After the etching is completed, ashing is usually done with an oxygen plasma, to sequentially reduce and remove the resist as illustrated by reference numbers 52, 53, and 54 in FIG. 7. However, the above-described self-hardening action cannot be prevented, and residues 54 are left on the center portion of each aluminum line 51. This situation is also shown in FIG. 8, where resist residues 54 that cannot be removed even by additional ashing remain on the center portion of each aluminum line 51.

A fifth problem is specific to melting - to ensure that sufficient flattening is obtained at a comparatively low temperature, surplus impurities must be added.

DISCLOSURE OF THE INVENTION

The semiconductor substrate surface processing method of the present invention is characterized in that a combustion flame of a gas that is a mixture of hydrogen and oxygen is applied to a semiconductor substrate surface, and only the substrate surface is heated thereby.

A ratio by volume of hydrogen to oxygen of 2:1 may be used, but a reducing flame can be obtained by using more hydrogen than in the 2:1 ratio and an oxidizing flame can be obtained by using more oxygen than in the 2:1 ratio.

The combustion flame used in the processing may preferably have a linear form that is longer than the diameter of the semiconductor substrate.

Heating enabled by the present invention enables various types of processing such as densification of a low-density deposited film, promotion of boundary reactions between different substances in direct contact, activation of a semiconductor substrate region implanted with an impurity, oxidation of a semiconductor substrate surface, ashing of a resist formed on a semiconductor substrate surface and of residues of such a resist, formation of a single-crystal structure from a polycrystalline or amorphous layer, or flattening of a layer formed on a semiconductor substrate surface by melting it.

A semiconductor substrate surface processing device in accordance with the present invention comprises a first conduit for guiding hydrogen; a second conduit for guiding oxygen; a flame generation means for combusting the hydrogen and the oxygen in a mixed state to generate downward-pointing flame over a range wider than the diameter of a semiconductor substrate that is being processed; a flow regulation means provided midway in each of the first conduit and the second conduit, for regulating the fluid passing through each of the first conduit and the second conduit; and a conveyor means for conveying the semiconductor substrate that is being processed, provided below the flame generation means.

The device is preferably also provided with a vertical control device for moving the flame generation means up and down to vary the distance between the flame generation means and the semiconductor substrate that is being processed, and also with a detection means for detecting a semiconductor surface temperature and a control means for controlling the flow regulation means and the vertical movement control device in accordance with a detection result from the detection means.

The flame generation means may be provided with a large number of nozzles arranged in a linear array, or a linear exit portion.

In accordance with the present invention, a semiconductor substrate surface is locally heated .by a combustion flame of a gas that is a mixture of hydrogen and oxygen. In other words, only the area to which the flame is applied is heated, so that the temperature of surface portions and the rear surface to which the flame is not applied does not rise. Complete combustion, with a flame that is neither oxidizing nor reducing, is obtained when the ratio of volume of hydrogen to oxygen is 2:1, but processing of different types can be obtained by varying the hydrogen/oxygen ratio to provide a reducing action or an oxidizing action in addition to simple heating.

BRIEF DESCRIPTION OF THE DRAWINGS

FIG. 3 is a perspective view of another example of the flame generation unit shown in FIGS. 1 and 2;

FIG. 4 is a cross-section through the unit of FIG. 3;

FIGS. 5a-5b are illustrative diagrams of states that provide a reducing flame and an oxidizing flame;

BEST MODE FOR CARRYING OUT THE INVENTION

Embodiments of the present invention will be described below in detail with reference to the attached drawings.

Figure 1:
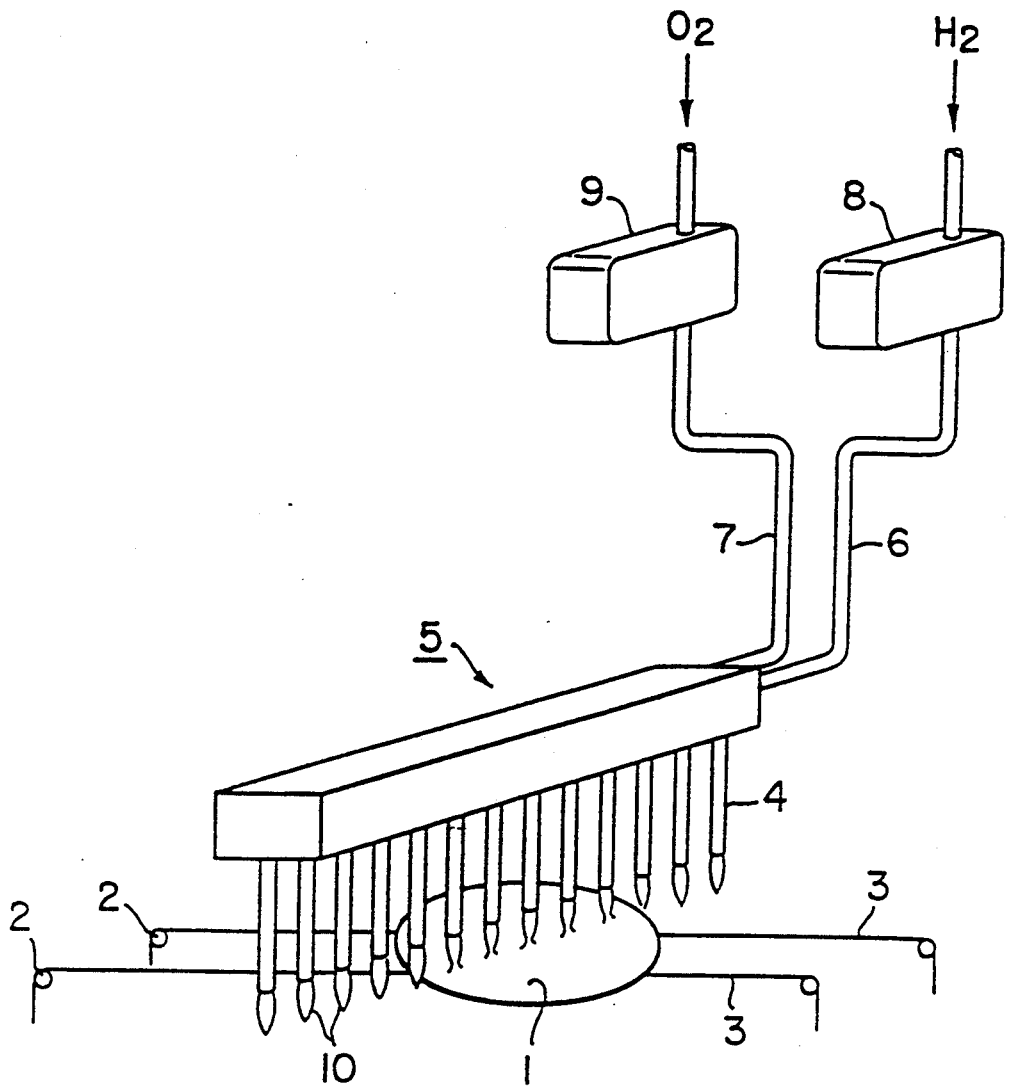
FIG. 1 is a diagram outlining the semiconductor substrate surface processing method of the present invention and a device using this method.

A perspective view outlining the semiconductor substrate surface processing method of the present invention and a device that uses for the method is shown in FIG. 1.

The device is provided with a wafer conveying mechanism having a pair of belts 3 driven by rollers 2 and conveying a wafer that is being processed 1, and partway along this mechanism is provided a flame generation unit 5 provided with two linear arrays, each consisting of a plurality of downward pointing nozzles 4. Note that the direction in which the nozzles 4 are arranged is perpendicular to the direction in which the belts 3 are provided. It is preferable that the range over which the nozzles 4 are arranged is greater than the diameter of the semiconductor substrates that are being processed. The flame generation unit 5 is connected to two conduits 6 and 7, hydrogen and oxygen flow through the respective conduits 6 and 7 via respective flow regulators 8 and 9 such as electromagnetic valves, and combustion flames 10 therefrom are directed downward from the ends of the nozzles 4.

Figure 2:
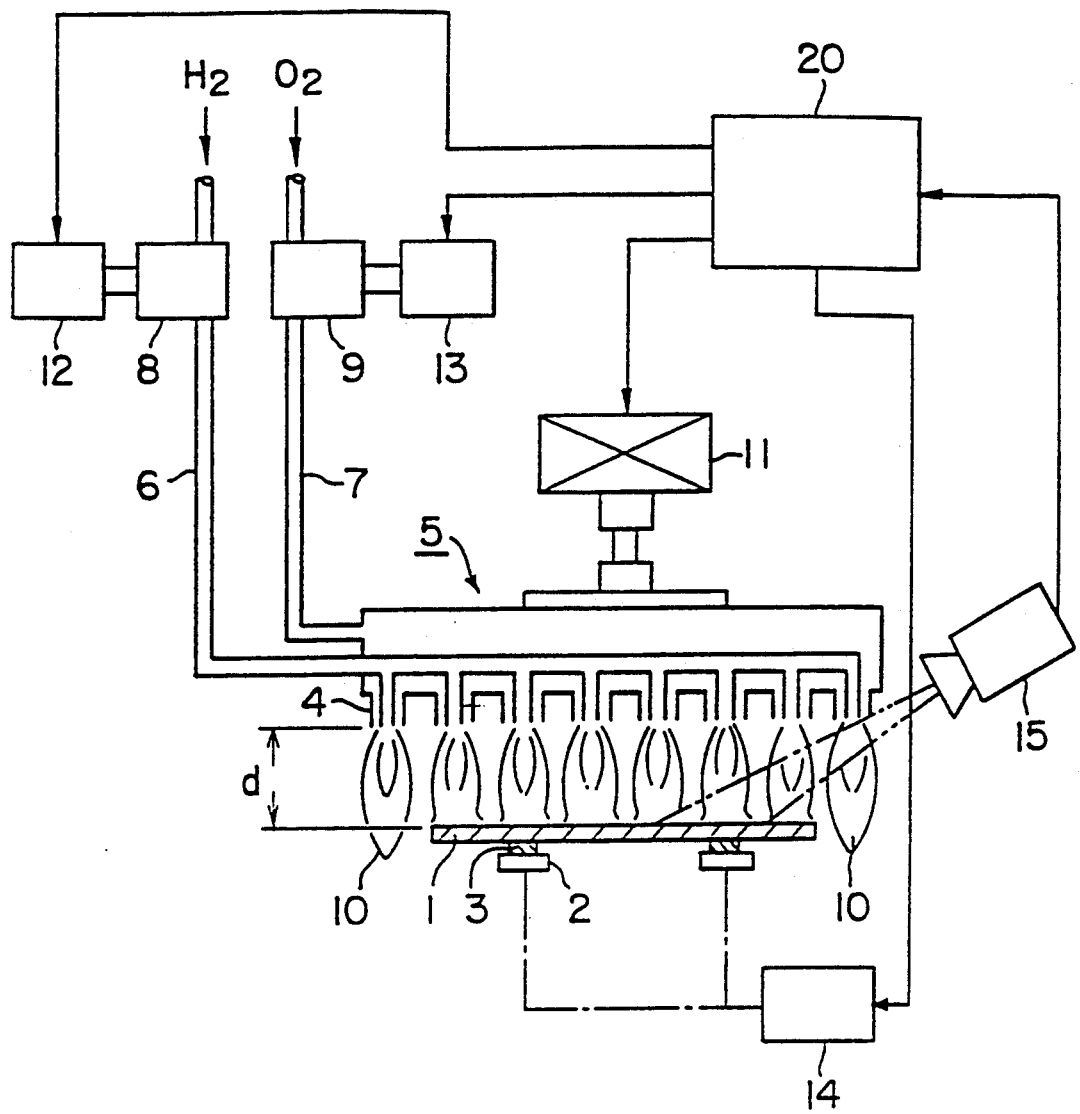
FIG. 2 is diagram illustrating a control state of the structure shown in FIG. 1.

A more detailed diagram, drawn from the control point of view, of the structure of FIG. 1 is shown in FIG. 2, illustrating how the device of the present invention is further provided with a vertical drive control device 11 for driving the flame generation unit 5 up and down in order to control the distance between the ends of the nozzles 4 and the wafer 1, flow control devices 12 and 13 for driving the respective flow regulating elements 8 and 9, and a conveyor control device 14 for driving the conveyor speed of the belts 3. The surface temperature of the wafer is detected by a radiation thermometer 15, and a detection output therefrom is sent to a control device 20. The control device 20 controls the vertical drive control device 11, the flow control devices 12 and 13, and the conveyor control device 14 in such a manner as to satisfy temperature conditions and heating times in accordance with the type of processing required and the size of the substrate that is being processed. Note that when the ratio by volume of the hydrogen with respect to the oxygen is 2:1, complete combustion is obtained and a steam atmosphere is generated. However, since an oxidizing flame is obtained if the proportion of hydrogen is higher or a reducing flame is obtained if the proportion of oxygen is higher, the ratio by volume of the hydrogen with respect to the oxygen can be regulated by the flow regulating elements 8 and 9 to suit the processing required.

A perspective view of a variation on the flame generation unit used by the device of the present invention is shown in FIG. 3, and a cross section taken through the center thereof is shown in FIG. 4.

This flame generation unit 30 is provided in an upper part thereof with a chamber 32 for blowing out oxygen, in such a manner that it surrounds on both sides a chamber 31 for blowing out hydrogen, which has a linear-shaped exit portion. In the center of the two chambers are provided dispersion plates 33 that efficiently change the direction of flow of the hydrogen or oxygen and also disperse the flow, and stationary plates 34 that steady the flow by making it pass through small holes or slits. Since edge portions of the two chambers are narrowed and are in close proximity with each other, hydrogen and oxygen mix at the edge portions and a linear combustion flame 35 is thereby obtained.

Other methods of forming a reducing flame and an oxidizing flame are shown in FIG. 5. A separate narrow tube 40 is provided beside the end portion of each nozzle 4, and air or oxygen is sent out from the narrow tube 40. In this case, if oxygen is blown out of the narrow tube FIG. 5(a), a reducing flame can be formed. Conversely, if the end portion of the narrow tube 40 is inserted into the flame 10, an oxidizing flame is produced.

Specific examples of different types of processing performed using the above device are described below.

(1) Thermal Processing

Figure 6:
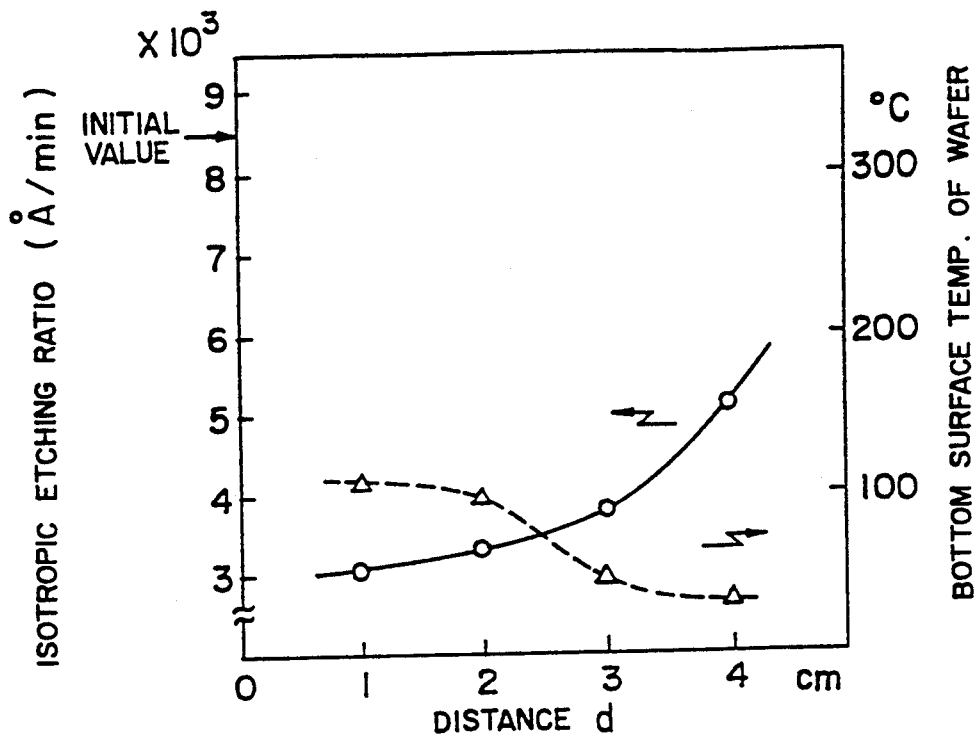
FIG. 6 is a graph illustrating results of heating a silicon dioxide layer.
Figure 7:
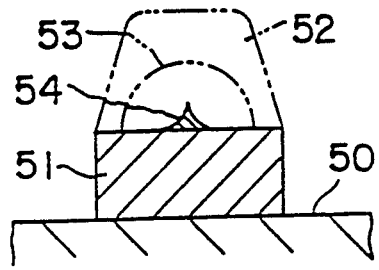
FIG. 7 is a cross-section illustrating a problem of a conventional ashing process.

A graph of a densification effect of silicon oxide films produced by chemical vapor deposition (CVD) is shown in FIG. 6. Since the density of a silicon oxide film deposited as is by CVD is low, the etching ratio obtained by isotropic etching using ammonium fluoride ($NH_4F$), for example, has a high initial value of approximately 8500 Å/min. If this silicon oxide film is thermally processed as shown in FIG. 1, the etching ratio decreases as the distance d between the ends of the nozzles 4 and the substrate surface that is being processed decreases, as is clear from the graph. For example, if d is 1 cm, the etching speed becomes approximately 3000 Å/min, which is the sort of effect that can be expected from severe combustion in processing at approximately 600° C. by ordinary annealing. Moreover, with the method of the present invention, the bottom surface temperature of the silicon semiconductor substrate is only about 120° C., so it is clear that only the required region of the surface is heated.

(2) Interface Reaction Promotion

Interface reactions between different substances can be promoted easily using the method of the present invention.

For example, when titanium and silicon are brought into contact to form a $TiSi_2$ layer, a flame whose reducing power has been increased by either increasing FIG. 5(a) is used to heat the surface of the silicon semiconductor substrate after the titanium is deposited, and thus prevent the titanium surface from oxidizing. The surface resistance after the heating has been confirmed to be reduced to less than it was before, and formation of the $TiSi_2$ layer has been confirmed. This reaction is suitable for processes where purity is particularly essential, but the method of the present invention is also valid where sufficient purity is required as a side effect.

(3) Activation

When the method shown in FIG. 1 is used to heat the surface of a semiconductor substrate to which has been added an impurity by a method such as ion implantation, it can activate the impurity without diffusing it.

(4) Surface Oxidation

With the method shown in FIG. 1, the surface of a semiconductor substrate can be heated by using an oxidizing flame produced by increasing the flow of oxygen to increase the oxygen ratio. This can be used to efficiently form an oxide layer in the vicinity of the surface of an aluminum or aluminum alloy layer, which can greatly improve the adhesion of a photoresist. During this time, the vertical drive control device 11 can be used to control the distance d between the nozzles 4 and the aluminum layer, in order to control the surface temperature to be less that the melting point of the aluminum or aluminum alloy. In this example, too, an oxidizing flame created by the method of FIG. 5(b) can be used.

(5) Ashing

Figure 8:
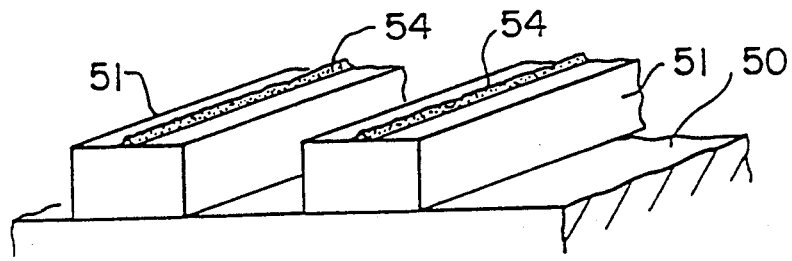
FIG. 8 is a perspective view illustrating the same problem of the conventional ashing process.

A semiconductor substrate which has resist residues left on aluminum patterns as shown in FIG. 8 can be heated by the device shown in FIG. 1. In this case, the residues on the surface can be removed by controlling the distance d between the ends of the nozzles 4 and the semiconductor substrate that is being processed (or, more accurately, the aluminum pattern thereof) and by controlling the flow rates of oxygen and hydrogen, in such a manner that the aluminum is not melted. Note that this method can of course be also used from the start to remove a thick layer of resist in one pass.

(6) Crystallization

The following description relates to an example of the application of SOJ which heats the vicinity of a surface after an amorphous layer is formed as an isolation layer on a semiconductor substrate that is being processed, to convert it into a single crystal.

First, the vicinity of the surface is locally heated by a combustion flame of hydrogen and oxygen, to form a single-crystal seed portion. During this time, the area exposed to the combustion flame is kept as small as possible because, if the area were too big, a number of seeds will be generated, impeding the formation of a complete single crystal. Next, the entire silicon semiconductor substrate that is being processed is sequentially exposed to a linear combustion flame such as that shown in FIG. 3, using the initially heated portion as a start point. This sequentially heats the silicon semiconductor substrate that is being processed to spread the initial single-crystal region to cover the entire surface.

(7) Flattening

A surface can be flattened by heating it with a combustion flame of hydrogen and oxygen, as shown in FIG. 1, but the temperature of the rear surface can be kept to below approximately 500° C. during the heating. Therefore, a sufficient flattening effect can be obtained while preventing an increase in the temperature of the entire semiconductor substrate that is being processed, keeping the heating to just the vicinity of the surface.

As described above, the method of the present invention can replace conventional surface processing performed by heating the entire substrate in a special environment. It can prevent the generation of contamination, cracking, and other damage that occurs with semiconductor substrates subjected to conventional overall heating, by using a flame obtained from a gas that is a mixture of hydrogen and oxygen to enable various different types of local processing of a surface of a semiconductor substrate, in particular, to enable processing restricted to the surface. In addition, the present invention removes the need for special processing that is performed conventionally, enabling heating-only processing.

We claim:

1. A semiconductor substrate surface processing method characterized in that a combustion flame formed of a gas that is a mixture of hydrogen and oxygen is applied to a semiconductor substrate surface, and that only said substrate surface is heated thereby.

2. A semiconductor substrate surface processing method in accordance with claim 1, wherein the ratio by volume of said hydrogen with respect to said oxygen is 2:1.

3. A semiconductor substrate surface processing method in accordance with claim 1, wherein said combustion flame has a reducing effect created by increasing the hydrogen in the ratio by volume of said hydrogen with respect to said oxygen, to increase said ratio to more than 2:1.

4. A semiconductor substrate surface processing method in accordance with claim 1, wherein said combustion flame has an oxidizing effect created by increasing the oxygen in the ratio by volume of said hydrogen with respect to said oxygen, to reduce said ratio to less than 2:1.

5. A semiconductor substrate surface processing method in accordance with claim 1, wherein said combustion flame has a linear shape longer than the diameter of said semiconductor substrate.

6. A semiconductor substrate surface processing method in accordance with claim 1, wherein the density of a low-density film deposited on said substrate surface is increased by said heating.

7. A semiconductor substrate surface processing method in accordance with claim 1, wherein an interface reaction between two substances in close contact is promoted by said heating.

8. A semiconductor substrate surface processing method in accordance with claim 1, wherein a semiconductor substrate region implanted with an impurity is activated by said heating.

9. A semiconductor substrate surface processing method in accordance with claim 1, wherein a semiconductor substrate surface is oxidized by said heating, using a flame with an oxidizing effect.

10. A semiconductor substrate surface processing method in accordance with claim 1, wherein a resist formed on a semiconductor substrate surface, or a residue of such a resist, is ashed by said heating.

11. A semiconductor substrate surface processing method in accordance with claim 1, wherein said heating is used locally to form a single-crystal seed in a polycrystalline or amorphous layer formed on a semiconductor substrate surface, and the heating range is then increased to expand the single-crystal region over the entire substrate surface.

12. A semiconductor substrate surface processing method in accordance with claim 1, wherein a layer formed on semiconductor substrate surface is melted and flattened by said heating.

* * * * *